US010535402B2

(12) United States Patent
Kang

(10) Patent No.: US 10,535,402 B2
(45) Date of Patent: Jan. 14, 2020

(54) RESISTANCE VARIABLE MEMORY APPARATUS

(71) Applicant: SK hynix Inc., Icheon-si, Gyeonggi-do (KR)

(72) Inventor: Jae Seok Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/681,151

(22) Filed: Aug. 18, 2017

(65) Prior Publication Data

US 2018/0082740 A1 Mar. 22, 2018

(30) Foreign Application Priority Data

Sep. 20, 2016 (KR) ........................ 10-2016-0119830

(51) Int. Cl.
*G11C 8/12* (2006.01)
*G11C 13/00* (2006.01)
*H01L 27/04* (2006.01)
*G11C 7/10* (2006.01)

(52) U.S. Cl.
CPC .......... *G11C 13/004* (2013.01); *G11C 7/1042* (2013.01); *G11C 8/12* (2013.01); *G11C 13/003* (2013.01); *G11C 13/0023* (2013.01); *G11C 13/0035* (2013.01); *G11C 13/0064* (2013.01); *G11C 13/0069* (2013.01); *H01L 27/04* (2013.01)

(58) Field of Classification Search
CPC ......... G11C 5/02; G11C 5/025; G11C 13/004; G11C 13/003; G11C 13/0035; G11C 13/0064; G11C 13/0069
USPC ............................................ 365/148, 51, 63
See application file for complete search history.

(56) References Cited

U.S. PATENT DOCUMENTS 7,616,630 B2 * 11/2009 Ha ......................... G11C 5/063 365/230.03
2008/0112251 A1 * 5/2008 Youn ...................... G11C 5/025 365/230.03
2009/0303825 A1 * 12/2009 Kim ......................... G11C 8/12 365/230.03

(Continued)

FOREIGN PATENT DOCUMENTS

KR 100920829 B1 10/2009
KR 1020120014136 A 2/2012

*Primary Examiner* — Alfredo Bermudez Lozada
(74) *Attorney, Agent, or Firm* — William Park & Associates Ltd.

(57) ABSTRACT

A resistance variable memory apparatus includes a memory cell array region and a peripheral region disposed along an edge of the memory cell region. The memory cell array region may have a plurality of memory banks each of which includes at least one memory block. The resistance variable memory apparatus may include a data transmission block transmitting data between the plurality of memory banks and the peripheral region. The data transmission block includes a plurality of lower global input/output lines shared by pairs of adjacent memory banks, a plurality of lower multiplexers receiving data from pairs of adjacent lower global input/output lines and outputting data inputted from one of the lower global input/output lines, and an upper multiplexer receiving data output from the plurality of lower multiplexers and outputting data input from one of the lower multiplexers.

16 Claims, 4 Drawing Sheets

(56) References Cited

U.S. PATENT DOCUMENTS

| | | | | |
|---|---|---|---|---|
| 2016/0005453 | A1* | 1/2016 | Seo | G11C 11/4093<br>365/189.02 |
| 2016/0313930 | A1* | 10/2016 | Harrand | G11C 7/1075 |

* cited by examiner

RESISTANCE VARIABLE MEMORY APPARATUS

CROSS-REFERENCES TO RELATED APPLICATION

The present application claims priority under 35 U.S.C. § 119(a) to Korean application number 10-2016-0119830 filed on Sep. 20, 2016, in the Korean Intellectual Property Office, which is incorporated herein by reference in its entirety.

BACKGROUND

1. Technical Field

Various embodiments generally relate to a semiconductor memory apparatus, and, more particularly, to a resistance variable memory apparatus.

2. Related Art

Memory apparatuses are semiconductor-based integrated circuits that may be used in computers or other electronic apparatuses. As is well known in the art, exemplary kinds of memories include various types of RAMs such as DRAM and SDRAM, various types of ROMs, flash memories, and resistance variable memories.

The resistance variable memory apparatus may include a switching element and a resistor element. The resistance variable memory apparatus may work by changing the resistance across a resistor element. Exemplary kinds of resistance variable memory apparatuses may include programmable conductor memories, resistive random access memories (ReRAM), and phase change random access memories (PCRAM).

Currently, research is being actively conducted on a 2-terminal device, which is capable of performing switching and memory functions.

SUMMARY

In an embodiment, a resistance variable memory apparatus may include a memory cell array region, a peripheral region, and a data transmission block. The peripheral region may be disposed along an edge of the memory cell region. The memory cell array region may have a plurality of memory banks each of which includes at least one memory block. The data transmission block may transmit data between the plurality of memory banks and the peripheral region. The data transmission block may include a plurality of lower global input/output lines, a plurality of lower multiplexers, and an upper multiplexer. The plurality of lower global input/output lines may be shared by pairs of adjacent memory banks among the plurality of memory banks. The plurality of lower multiplexers may receive data from pairs of adjacent lower global input/output lines among the plurality of lower global input/output lines, and outputting data input from one selected between the lower global input/output lines. The upper multiplexer may receive data output from the plurality of lower multiplexers, and may output data input from one selected between the lower multiplexers.

In an embodiment, a resistance variable memory apparatus may include a peripheral region, a plurality of memory banks, a first data transmission block, and a second data transmission block. The plurality of memory banks may include first memory banks which are located relatively close to the peripheral region and second memory banks which are located relatively far from the peripheral region. The first data transmission block may transmit data between the first memory banks and the peripheral region. The second data transmission block may transmit data between the second memory banks and the peripheral region. A data transmission line of the first data transmission block may be configured to detour around circuits located on opposite side of the peripheral region, and a data transmission line of the second data transmission block may be connected to the peripheral region through a short route.

In an embodiment, a resistance variable memory apparatus may include a memory cell array, a plurality of first selection circuits, a plurality of second selection circuits, and a signal transmission circuit. The memory cell array may include a plurality of pairs of memory banks. Here, memory banks of each pair may share input/output lines. Each first selection circuit may be coupled to at least two input/output lines, and may select one of the at least two input/output. Each second selection circuit may be coupled to at least two first selection circuits, and may select one of data signals that are output from the at least two first selection circuits. The signal transmission circuit may receive data signals selected by the plurality of second selection circuits and transmit the data signals to a peripheral region.

DETAILED DESCRIPTION

Hereinafter, a resistance variable memory apparatus will be described below with reference to the accompanying drawings through various examples of embodiments.

Figure 1:
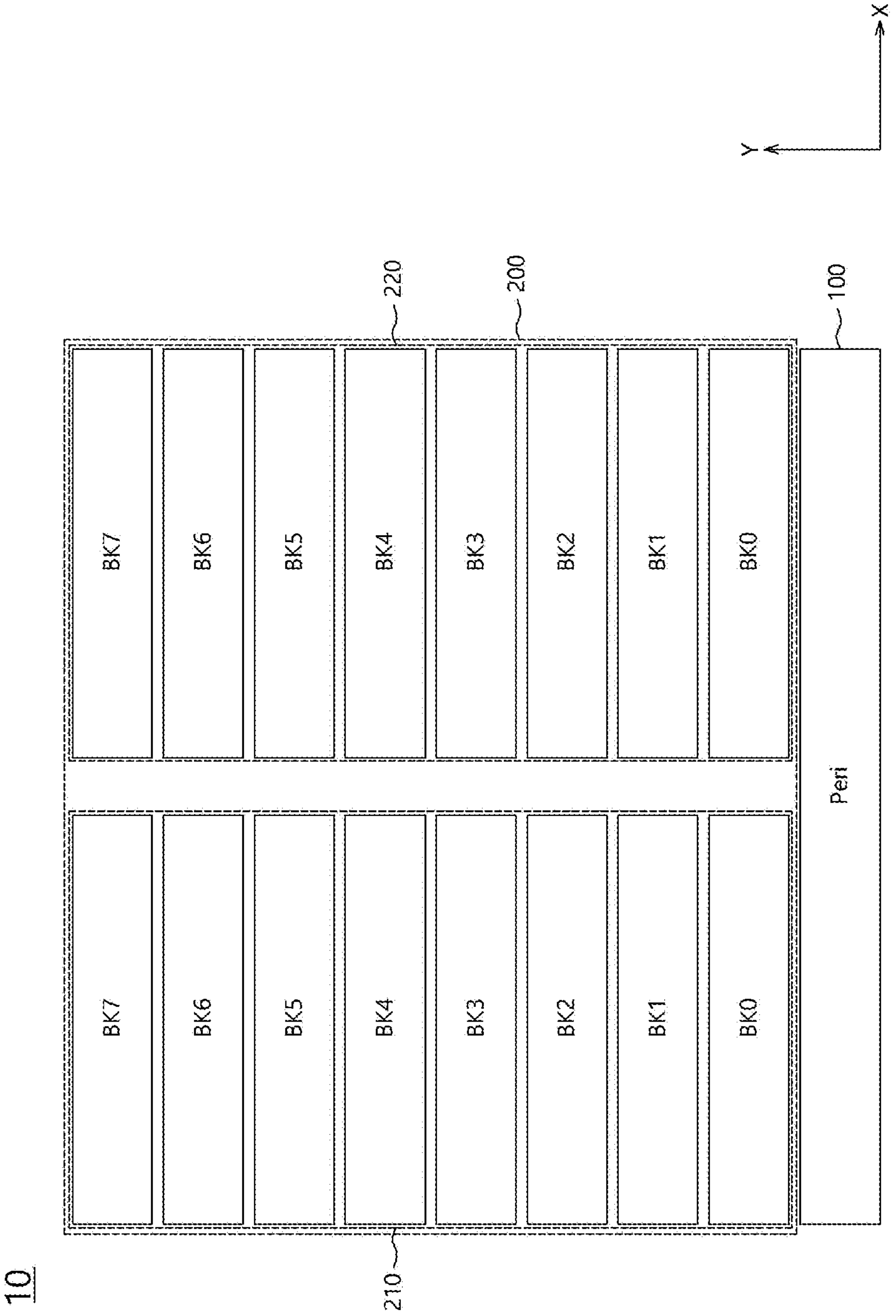
FIG. 1 is a layout diagram illustrating an example of a resistance variable memory apparatus in accordance with an embodiment.

FIG. 1 is a layout diagram illustrating an example of a resistance variable memory apparatus in accordance with an embodiment.

Referring to FIG. 1, a resistance variable memory apparatus 10 in accordance with an embodiment may include a peripheral region 100 and a memory cell array region 200.

The peripheral region 100 may include various circuits (not illustrated) for controlling the operation of the memory cell array region 200. Also, the peripheral region 100 may include a plurality of input/output pads (not illustrated) for receiving write-requested data from an external device (e.g., a host device). The data may be read out via the input/output pads in response to a read request from the external device. The plurality of input/output pads disposed in the peripheral region 100 may be coupled to the memory cell array region 200 through global input/output lines which will be described later.

The memory cell array region 200 may be disposed next to the peripheral region 100. The peripheral region 100 may be disposed along an edge of memory cell array region 200. For example, the peripheral region 100 may extend in an X-axis direction along an edge of memory cell array region 200 where the memory cell array region 200 extends in a Y-axis direction. The memory cell array region 200 may include a first memory bank group 210 and a second memory bank group 220. For example, the first memory bank group 210 and the second memory bank group 220 may be arranged in the X-axis direction along an edge of the peripheral region 100, and memory banks constituting the first memory bank group 210 and memory banks constituting the second memory bank group 220 are arranged in the Y-axis direction, respectively.

Each of the first memory bank group 210 and the second memory bank group 220 may include a plurality of memory banks. For the sake of convenience in explanation, it is assumed that, as shown in FIG. 1, each of the first memory bank group 210 and the second memory bank group 220 includes eight memory banks BK0 to BK7.

The respective memory banks BK0 to BK7 of the first memory bank group 210 and the respective memory banks BK0 to BK7 of the second memory bank group 220 may be sequentially arranged in the Y-axis direction from one side of the peripheral region 100. For example, the memory bank BK0 may be disposed at a position closest to the peripheral region 100, and the memory bank BK7 may be disposed at a position farthest from the peripheral region 100.

That is to say, when viewed from above, the first memory bank group 210 and the second memory bank group 220 may be arranged in the X-axis direction along the peripheral region 100. The memory banks BK0 to BK7 of the first memory bank group 210 and the second memory bank group 220 may be arranged in the Y-axis direction, and may be parallel to one another. Each of the memory banks BK0 to BK7 of the first memory bank group 210 may be disposed next to a corresponding one of the memory banks BK0 to BK7 of the second memory bank group 220.

Each of the memory banks BK0 to BK7 of the first memory bank group 210 and each of the memory banks BK0 to BK7 of the second memory bank group 220 may include a plurality of memory blocks. For the sake of convenience in explanation, it is assumed that each of the memory banks BK0 to BK7 includes eight memory blocks BLK0 to BLK7. One memory bank BK including eight memory blocks BLK0 to BLK7 is illustrated in FIG. 2.

Figure 2:
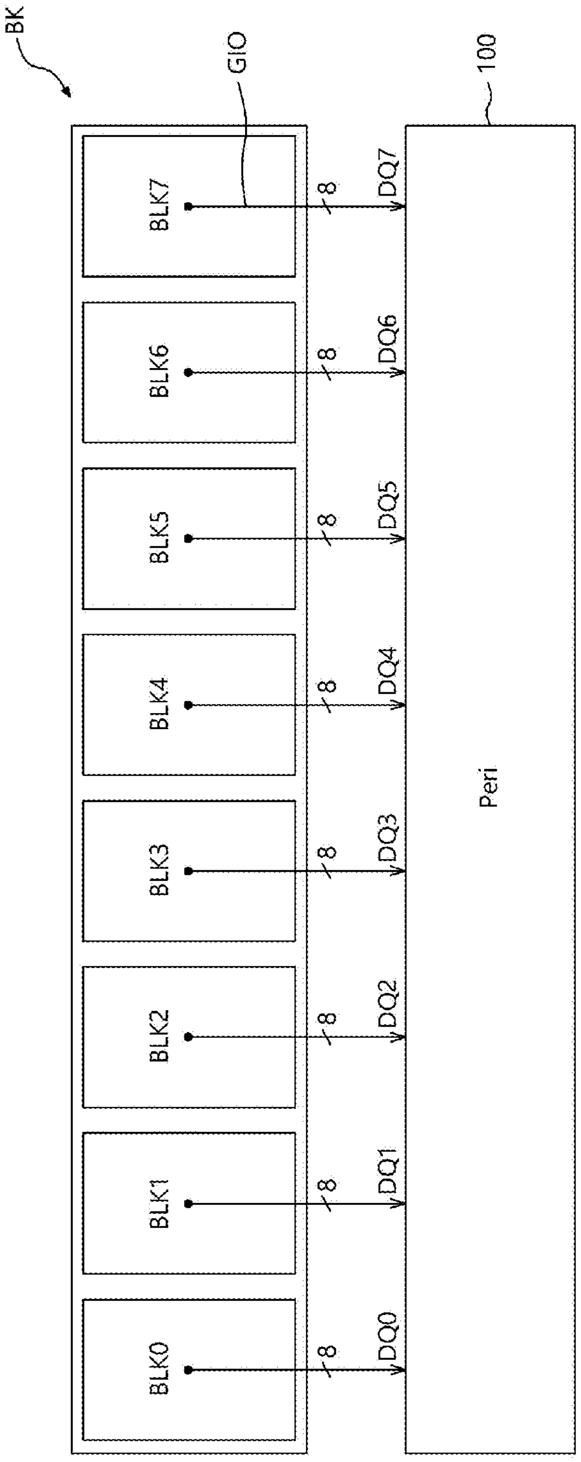
FIG. 2 is a diagram illustrating an example of a plurality of memory blocks disposed in a memory bank of FIG. 1 and global input/output lines coupled to the respective memory blocks.

While not illustrated in FIG. 2, each of the memory blocks BLK0 to BLK7 may include a plurality of mats, and each of the mats may include a plurality of memory cells.

Referring to FIG. 2, in a read operation, eight data units may be read from each of the memory blocks BLK0 to BLK7. Here, the "data unit" may refer to smallest addressable unit of data, such as a bit, a byte, or a word. For example, if a read request is issued from a host device, the resistance variable memory apparatus 10 may output sixty-four data units from a memory bank corresponding to read-requested address received from the host device. In other words, data DQ0 to DQ7 may be read by eight data units from each of the eight memory blocks BLK0 to BLK7 shown in FIG. 2, and sixty-four data units DQ0 to DQ7 in total may be provided to the input/output pads of the peripheral region 100 through corresponding global input/output lines GIO. To this end, eight global input/output lines GIO may be coupled between each of the memory blocks BLK0 to BLK7 and the peripheral region 100. The respective global input/output lines GIO may be coupled to the plurality of memory cells included in each of the memory blocks BLK0 to BLK7. In this way, the data stored in memory cells corresponding to a read-requested address, among the plurality of memory cells, may be transmitted to the peripheral region 100 through a corresponding global input/output line GIO.

In accessing memory cells to read out data at a high speed and transmit a large amount of data within a predetermined time, a memory bank interleaving method may be used. The memory bank interleaving method is a method that outputs data from another memory bank while data is being output from a certain memory bank and then being stored again in the certain memory bank. The memory bank interleaving method may reduce a data access time because it enables data to be successively output. As a result, the read failure rate may decrease.

However, as shown in FIG. 1, as the first and second memory bank groups 210 and 220 are disposed along an X-axis-direction edge of the peripheral region 100 and the memory banks BK0 to BK7 are arranged in the Y-axis direction, there are wide variations in distances between the peripheral region 100 and the memory banks BK0 to BK7. This leads to an increase in the difference between a data transmission time from the memory bank BK0 to the peripheral region 100 and a data transmission time from the memory bank BK7 to the peripheral region 100.

In other words, a length of time it takes to read out data to the peripheral region 100 from the memory bank BK7 is very longer than a length of time it takes to read out data to the peripheral region 100 from the memory bank BK0. As a result, when a read operation is performed on the memory bank BK0 after a read operation is performed on the memory bank BK7, a timing conflict between the data output from the memory bank BK7 and the data output from the memory bank BK0 may occur. In this case, a read failure may occur.

In addition, due to the wide variations in distances between the peripheral region 100 and the memory banks BK0 to BK7, an interleaving margin between the memory bank BK7 and the memory bank BK0 may decrease, which may render an interleaving operation impossible.

Therefore, in order to secure an interleaving margin among the memory banks BK0 to BK7, it is necessary to minimize the variation of data transmission distance (or data transmission time) among the memory banks BK0 to BK7.

Figure 3:
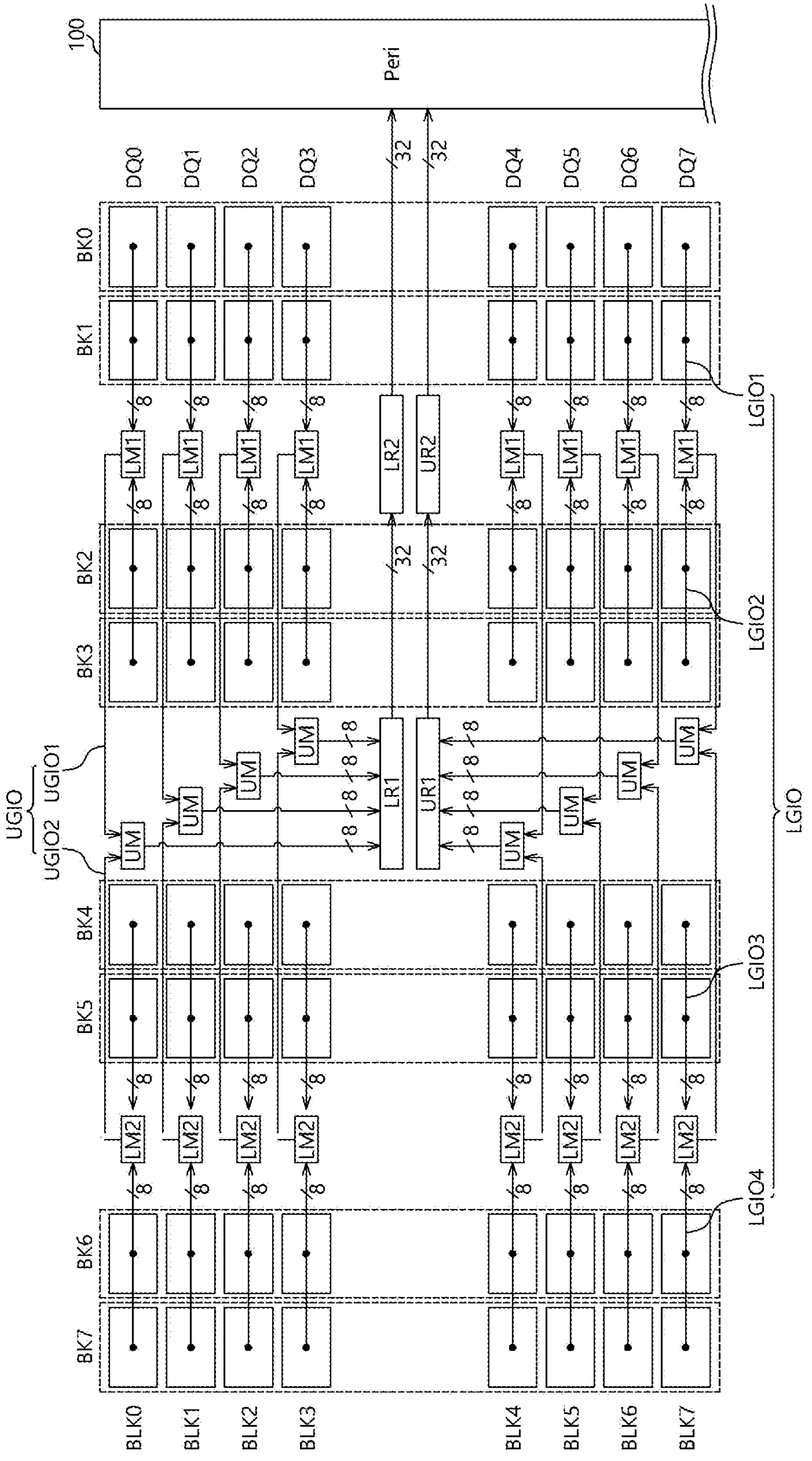
FIG. 3 is a diagram illustrating an example layout of the global input/output lines of the resistance variable memory apparatus in accordance with an embodiment.

FIG. 3 is a diagram illustrating an example layout of the global input/output lines of the resistance variable memory apparatus in accordance with an embodiment. For the sake of convenience in explanation, one memory bank group of the memory bank groups 210 and 220 shown in FIG. 1 is illustrated in FIG. 3. It is to be noted that the other memory bank groups may have the same structure as the memory bank group illustrated in FIG. 3.

Referring to FIG. 3, the resistance variable memory apparatus 10 may include eight memory banks BK0 to BK7 each including eight memory blocks BLK0 to BLK7. The resistance variable memory apparatus 10 may also include the peripheral region 100. Also, the resistance variable memory apparatus 10 may include a data transmission block for transferring data between the respective memory blocks BLK0 to BLK7 of the respective memory banks BK0 to BK7 and the peripheral region 100.

The data transmission block may include a plurality of lower global input/output lines LGIO, a plurality of upper global input/output lines UGIO, a plurality of lower multiplexers LM, a plurality of upper multiplexers UM, and a plurality of repeaters LR1, LR2, UR1, and UR2. Here, the terms "lower" and "upper" do not necessarily mean physical positions, but are used to distinguish between two groups of global input/output lines, between two groups of multiplexers, and between two groups of repeaters.

The plurality of lower global input/output lines LGIO may include first to fourth lower global input/output lines LGIO1 to LGIO4 which are shared by two adjacent memory banks among the eight memory banks BK0 to BK7.

The first lower global input/output line LGIO1 may be shared by the first and second memory banks BK0 and BK1 which are adjacent to the peripheral region 100. For example, the first lower global input/output lines LGIO1 may include eight first lower global input/output lines LGIO1 which are shared by the respective memory blocks BLK0 to BLK7 of the first memory bank BK0 and the respective memory blocks BLK0 to BLK7 of the second memory bank BK1. Further, the first lower global input/output lines LGIO1 may include eight lower global input/output lines.

The second lower global input/output lines LGIO2 may be shared by the third and fourth memory banks BK2 and BK3 adjacent to the second memory bank BK1. The third lower global input/output lines LGIO3 may be shared by the fifth and sixth memory banks BK4 and BK5 adjacent to the fourth memory bank BK3. The fourth lower global input/output lines LGIO4 may be shared by the seventh and eighth memory banks BK6 and BK7 adjacent to the sixth memory bank BK5.

The second lower global input/output lines LGIO2 may include eight lower global input/output lines LGIO2 which are shared by the respective memory blocks BLK0 to BLK7 of the third memory bank BK2 and the respective memory blocks BLK0 to BLK7 of the fourth memory bank BK3. The third lower global input/output lines LGIO3 may include eight lower global input/output lines LGIO3 which are shared by the respective memory blocks BLK0 to BLK7 of the fifth memory bank BK4 and the respective memory blocks BLK0 to BLK7 of the sixth memory bank BK5. The fourth lower global input/output lines LGIO4 may include eight lower global input/output lines LGIO4 which are shared by the respective memory blocks BLK0 to BLK7 of the seventh memory bank BK6 and the respective memory blocks BLK0 to BLK7 of the eighth memory bank BK7.

Each of the second to fourth lower global input/output lines LGIO2 to LGIO4 may include eight lower global input/output lines.

Each of the plurality of lower multiplexers LM may receive data from two lower global input/output lines adjacent thereto, and may output the data input from one lower global input/output line selected between the two lower global input/output lines, to a corresponding upper multiplexer UM.

The plurality of lower multiplexers LM may include a plurality of first lower multiplexers LM1 and a plurality of second lower multiplexers LM2. Each first lower multiplexer LM1 may receive the data transmitted from the plurality of first lower global input/output lines LGIO1 and the plurality of second lower global input/output lines LGIO2. Each second lower multiplexer LM2 may receive the data transmitted from the plurality of third lower global input/output lines LGIO3 and the plurality of fourth lower global input/output lines LGIO4.

For example, each first lower multiplexer LM1 may receive the data transmitted from a corresponding first lower global input/output line LGIO1 and the data transmitted from a corresponding second lower global input/output line LGIO2. Each first lower multiplexer LM1 may select read-requested data between the two data, and may output selected data to a corresponding upper multiplexer UM.

Further, each second lower multiplexer LM2 may receive the data transmitted from a corresponding third lower global input/output line LGIO3 and the data transmitted from a corresponding fourth lower global input/output line LGIO4. Each second lower multiplexer LM2 may select read-requested data between the two data, and may output selected data to a corresponding upper multiplexer UM.

The plurality of upper global input/output lines UGIO may include a plurality of first upper global input/output lines UGIO1 and a plurality of second upper global input/output lines UGIO2. Each first upper global input/output line UGIO1 may couple the plurality of first lower multiplexers LM1 to upper multiplexers UM, and each second upper global input/output line UGIO2 may couple the plurality of second lower multiplexers LM2 to upper multiplexers UM. Each of the upper global input/output lines UGIO may include eight upper global input/output lines.

The plurality of upper multiplexers UM may receive the two data units from the plurality of first lower multiplexers LM1 and the plurality of second lower multiplexers LM2, respectively. The plurality of upper multiplexers UM may select read-requested data between the two data units, and may output selected data to the repeaters LR1 and UR1. Each upper multiplexer UM may be coupled to eight input/output lines.

The plurality of repeaters LR1, LR2, UR1, and UR2 may receive the data from the plurality of upper multiplexers UM and output the data to the peripheral region 100.

The plurality of repeaters LR1, LR2, UR1, and UR2 may include first repeaters LR1 and UR1, which directly receive the data from the plurality of upper multiplexers UM, and second repeaters LR2 and UR2, which receive the data from the first repeaters LR1 and UR1 and transmit the data to the peripheral region 100.

The first repeaters LR1 and UR1 may include a first lower repeater LR1, which receives lower-numbered data units DQ0 to DQ3 from the lower-numbered memory blocks BLK0 to BLK3 of the respective memory banks BK0 to BK7, and a first upper repeater UR1, which receives higher-numbered data units DQ4 to DQ7 from the higher-numbered memory blocks BLK4 to BLK7 of the respective memory banks BK0 to BK7.

Also, the second repeaters LR2 and UR2 may include a second lower repeater LR2, which receives the data from the first lower repeater LR1, and a second upper repeater UR2, which receives the data from the first upper repeater UR1.

The read operations of the respective memory banks BK0 to BK7 in accordance with an embodiment will be described below with reference to FIG. 3.

For example, in the case where a read-requested address provided from the host device belongs to the first memory bank BK0, the first lower global input/output lines LGIO1 coupled to the respective memory blocks BLK0 to BLK7 of the first memory bank BK0 may be activated, and the remaining lower global input/output lines LGIO2 to LGIO4 may be deactivated.

Thereafter, the data DQ0 to DQ7 read from the corresponding address may be respectively input to the corresponding first lower multiplexers LM1, and the first lower multiplexers LM1 may select one or more of the data units DQ0 to DQ7 input from the first lower global input/output lines LGIO1, by referring to the read-requested address. The selected data units selected between the data units DQ0 to DQ7 may be output to the corresponding upper multiplexers UM through the first upper global input/output lines UGIO1. Then, the upper multiplexers UM may select one or more of the data units DQ0 to DQ7 input from the first upper global input/output lines UGIO1, by referring to the read-requested address, and the selected data units selected between the data units DQ0 to DQ7 may be output to the first repeaters LR1 and UR1. The first repeaters LR1 and UR1 may output the input data DQ0 to DQ7 to the second repeaters LR2 and UR2, and the second repeaters LR2 and UR2 may output the input data DQ0 to DQ7 to corresponding input/output pads of the peripheral region 100.

While the above description contains many specificities, these should not be construed as limitations on the scope of the invention. For example, although the read-requested address is described as belonging to the first memory bank BK0, it is to be noted that the read-requested address may belong to the other memory blocks, and the same read operation may be performed with respect to all the memory banks BK0 to BK7.

In an embodiment, in order to minimize the variation in data transmission distance (or time) between a memory bank close to the peripheral region 100 and a memory bank far from the peripheral region 100, the global input/output lines coupled to memory banks relatively close to the peripheral region 100 may detour around some circuits located on opposite side of the peripheral region 100, instead of a straight route to the peripheral region 100, and the global input/output lines coupled to memory banks relatively far from the peripheral region 100 may be formed in a way that is connected to the peripheral region 100 through a short route.

That is to say, the data read from memory banks relatively close to the peripheral region 100 (e.g., the memory banks BK0 to BK3) may be detoured when transmitted to the peripheral region 100. As a result, the difference between a time it takes to transfer the data from memory banks relatively close to the peripheral region 100 (e.g., the memory banks BK0 to BK3) to the peripheral region 100 and a time it takes to transfer the data from memory banks relatively far from the peripheral region 100 (e.g., the memory banks BK4 to BK7) to the peripheral region 100 may be minimized. Therefore, an interleaving margin between memory banks may be secured.

For example, when a read operation is performed on the memory bank BK0 close to the peripheral region 100 right after a read operation has been performed on the memory bank BK7 distant from the peripheral region 100, since the data read from the memory bank BK0 may be detoured when transmitted to the peripheral region 100, it is possible to prevent a read failure from occurring by avoiding a timing conflict between the data read from the memory bank BK7 and the data read from the memory bank BK0.

In an embodiment, a resistance variable memory apparatus may include a memory cell array 200, a plurality of first selection circuits, a plurality of second selection circuits, and a signal transmission circuit. The memory cell array may include a plurality of pairs of memory blocks BLK0 to BLK7 of memory banks BK0 to BK7. Here, memory blocks of each pair may share input/output lines LGIO. Each first selection circuit may be coupled to at least two input/output lines, and may select one of the at least two input/output lines LGIO. Each second selection circuit may be coupled to at least two first selection circuits, and may select one of data signals that are output from the at least two first selection circuits. The signal transmission circuit may receive data signals selected by the plurality of second selection circuits and transmit the data signals to a peripheral region. Here, the first selection circuit may include a multiplexer LM, and the second selection circuit may include a multiplexer UM. Each of the first selection circuits is located between two pairs of memory banks. Each of the second selection circuits is located between two first selection circuits such that a distance between the second selection circuit and one of the two first selection circuits is similar to a distance between the second selection circuit and the other of the two first selection circuits. The signal transmission circuit includes a repeater LR1 and UR1. The second selection circuits may be divided into two groups, and the signal transmission circuit may be located between the two groups of second selection circuits.

Figure 4:
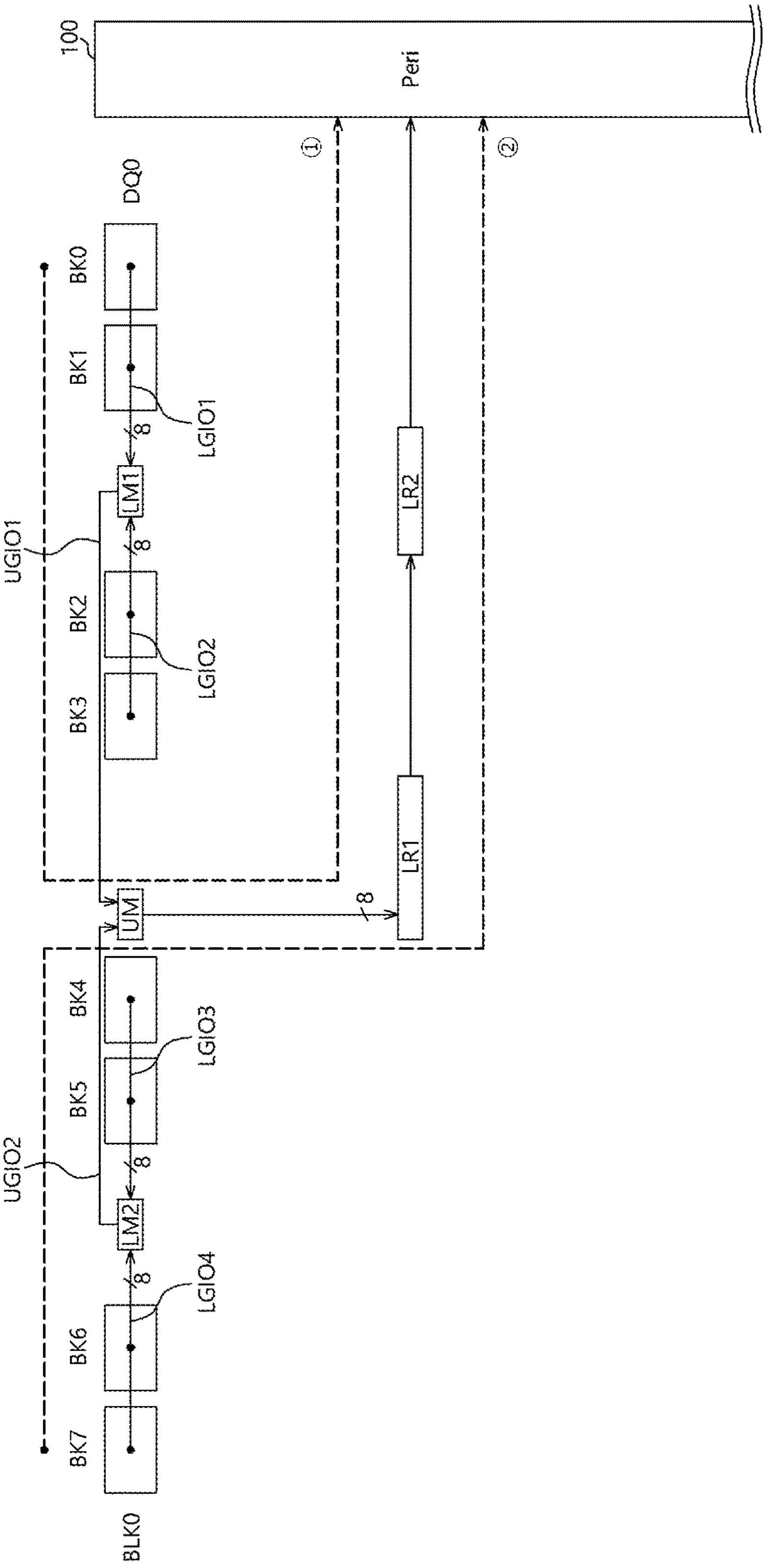
FIG. 4 is a diagram conceptually illustrating a data transmission distance of a memory bank BK0 close to a peripheral region and a data transmission distance of a memory bank BK7 distant from the peripheral region.

FIG. 4 is a diagram conceptually illustrating the data transmission distances of the memory bank BK0 and the memory bank BK7. For the sake of convenience in explanation, only one memory block BLK0 is illustrated in each of the memory banks BK0 to BK7.

Referring to FIG. 4, the transmission line of the data DQ0 read from the memory block BLK0 of the memory bank BK0 is denoted as "①" and the transmission line of the data DQ0 read from the memory block BLK0 of the memory bank BK7 is denoted as "②." Here, the physical length of the transmission line denoted as "①" and the physical length of the transmission line denoted as "②" may be similar to each other.

While various embodiments have been described above, it will be understood to those skilled in the art that the embodiments described are examples only. Accordingly, the resistance variable memory apparatus described herein should not be limited based on the described embodiments.

What is claimed is:

1. A resistance variable memory apparatus comprising:

a memory cell array region and a peripheral region disposed along one side edge of the memory cell array region, the memory cell array region having a plurality of memory banks arranged in a direction perpendicular to a direction in which the peripheral region extends and which are adjacent to each other; and a data transmission block configure to transmit data between the plurality of memory banks and the peripheral region, the data transmission block comprising:

a plurality of lower global input/output lines, wherein each of the plurality of lower global input/output lines is shared by pairs of adjacent memory banks among the plurality of memory banks;

a plurality of lower multiplexers configure to receive data from pairs of corresponding lower global input/output lines among the plurality of lower global input/output lines, and output data input from one selected between the pairs of lower global input/output lines; and a plurality of upper multiplexers configure to receive the data output from pairs of corresponding lower multiplexers among the plurality of lower multiplexers, and output data input from one selected between the pairs of lower multiplexers.

2. The resistance variable memory apparatus according to claim 1, wherein the plurality of lower global input/output lines comprise:

a first lower global input/output line coupled to a first pair of memory banks most adjacent to the peripheral region among the plurality of memory banks;

a second lower global input/output line coupled to a second pair of memory banks adjacent to the first pair of memory banks among the plurality of memory banks;

a third lower global input/output line coupled to a third pair of memory banks adjacent to the second pair of memory banks among the plurality of memory banks; and a fourth lower global input/output line coupled to a fourth pair of memory banks adjacent to the third pair of memory banks among the plurality of memory banks.

3. The resistance variable memory apparatus according to claim 2, wherein the plurality of lower multiplexers comprise:

a first lower multiplexer configure to receive data from the first lower global input/output line and the second lower global input/output line, and output data input from the first lower global input/output line or the second lower global input/output line, to a corresponding upper multiplexer among the plurality of upper multiplexers; and a second lower multiplexer configure to receive data from the third lower global input/output line and the fourth lower global input/output line, and output data input from the third lower global input/output line or the fourth lower global input/output line, to a corresponding upper multiplexer among the plurality of upper multiplexers.

4. The resistance variable memory apparatus according to claim 1, wherein the data transmission block further comprises a plurality of repeaters configure to receive data output from the upper multiplexer and output the data to the peripheral region.

5. The resistance variable memory apparatus according to claim 4, wherein the plurality of repeaters comprise:

a first repeater configure to directly receive data output from the upper multiplexer, and output the data; and a second repeater configure to receive data output from the first repeater, and output the data to the peripheral region.

6. The resistance variable memory apparatus according to claim 4, wherein each of the memory banks includes a plurality of memory blocks, wherein the plurality of memory blocks comprise lower memory blocks in which lower data are stored and upper memory blocks in which upper data are stored, and wherein the plurality of repeaters comprise a lower repeater which is inputted with lower data outputted from lower memory blocks of the respective memory banks, from the upper multiplexer, and an upper repeater which is inputted with upper data outputted from upper memory blocks of the respective memory banks, from the upper multiplexer.

7. A resistance variable memory apparatus comprising:

a peripheral region;

a plurality of memory banks including first memory banks and second memory banks, wherein the first memory banks are located relatively close to the peripheral region and the second memory banks are located relatively far from the peripheral region;

a first data transmission block configure to transmit data between the first memory banks and the peripheral region; and a second data transmission block configure to transmit data between the second memory banks and the peripheral region, wherein a data transmission line of the first data transmission block is connected to the peripheral region by detouring around circuits located on opposite side of the peripheral region, and a data transmission line of the second data transmission block is connected to the peripheral region through a separate route, wherein the first memory banks comprise a first pair of memory banks which are adjacent to the peripheral region and a second pair of memory banks which are adjacent to the first pair of memory banks and the second memory banks comprise a third pair of memory banks which are adjacent to the second pair of memory banks and a fourth pair of memory banks which are adjacent to the third pair of memory banks, and wherein the first data transmission block comprises a first global input/output line coupled to the first pair of memory banks, a second global input/output line coupled to the second pair of memory banks and a first lower multiplexer configure to receive data from the first global input/output line and the second global input/output line, and output selected data.

8. The resistance variable memory apparatus according to claim 7, wherein the second data transmission block comprises:

a third global input/output line coupled to the third pair of memory banks;

a fourth global input/output line coupled to the fourth pair of memory banks; and a second lower multiplexer configure to receive data from the third global input/output line and the fourth global input/output line, and output selected data.

9. The resistance variable memory apparatus according to claim 8, further comprising:

a multiplexer configure to receive data output from the first data transmission block and data output from the second data transmission block, and output selected data.

10. The resistance variable memory apparatus according to claim 9, further comprising:

at least one repeater configure to receive data output from the multiplexer, and output the data to the peripheral region.

11. A resistance variable memory apparatus comprising:

a memory cell array including a plurality of pairs of memory banks;

a plurality of input/output lines, wherein each of the plurality of input/output lines is shared by memory banks of each pair;

a plurality of first selection circuits, each first selection circuit being coupled to pairs of corresponding input/output lines among the plurality of input/output lines, selecting one of the pairs of input/output lines, and outputting data input from the selected pairs of input/output lines;

a plurality of second selection circuits, each second selection circuit being coupled to pairs of corresponding first selection circuits among the plurality of first selection circuits, selecting one of data signals that are output from the pairs of first selection circuits, and outputting data input from the selected pairs of first selection circuits; and a signal transmission circuit configured to receive data signals selected by the plurality of second selection circuits and transmit the data signals to a peripheral region.

12. The resistance variable memory apparatus according to claim 11, wherein the selection circuit includes a multiplexer.

13. The resistance variable memory apparatus according to claim 11, wherein each of the first selection circuits is located between two pairs of memory banks.

14. The resistance variable memory apparatus according to claim 13, wherein each of the second selection circuits is located between two first selection circuits such that a distance between the second selection circuit and one of the two first selection circuits is similar to a distance between the second selection circuit and the other of the two first selection circuits.

15. The resistance variable memory apparatus according to claim 11, wherein the signal transmission circuit includes a repeater.

16. The resistance variable memory apparatus according to claim 11, wherein the second selection circuits are divided into two groups, and the signal transmission circuit is located between the two groups of second selection circuits.

* * * * *